United States Patent
Hayn et al.

(10) Patent No.: US 8,890,444 B2
(45) Date of Patent: Nov. 18, 2014

(54) ELECTRON GUN USED IN PARTICLE BEAM DEVICE

(75) Inventors: Armin Heinz Hayn, Saffron Walden (GB); Mohamed El-Gomati, Osbaldwick (GB)

(73) Assignees: Carl Zeiss Microscopy Limited, Cambridge, Cambridgeshire (GB); York Probe Sources Limited, Osbaldwick, York (GB)

( * ) Notice: Subject to any disclaimer, the term of this patent is extended or adjusted under 35 U.S.C. 154(b) by 161 days.

(21) Appl. No.: 12/653,549

(22) Filed: Dec. 15, 2009

(65) Prior Publication Data
US 2010/0320942 A1    Dec. 23, 2010

(30) Foreign Application Priority Data

Jun. 18, 2009 (EP) .................................. 09163176

(51) Int. Cl.
*H01J 29/51*   (2006.01)
*H01J 37/063*   (2006.01)

(52) U.S. Cl.
CPC ..... *H01J 37/063* (2013.01); *H01J 2237/06341* (2013.01); *H01J 2237/06308* (2013.01); *H01J 2237/06375* (2013.01)
USPC ............ 315/379; 313/363; 313/414; 313/447

(58) Field of Classification Search
USPC ............................ 315/379; 313/363, 414, 447
See application file for complete search history.

(56) References Cited

U.S. PATENT DOCUMENTS 3,462,635 A * 8/1969 Broers .......................... 313/311
4,766,320 A   8/1988 Naitoh et al.
2004/0173747 A1 * 9/2004 Dean et al. ..................... 250/310
2008/0211376 A1 * 9/2008 Yasuda et al. .................. 313/414
2010/0019648 A1 * 1/2010 Yasuda et al. .................. 313/412
2010/0193687 A1 * 8/2010 Fujieda et al. ................. 250/310

FOREIGN PATENT DOCUMENTS

| EP | 1 947 674 A1 | 7/2008 |
| EP | 1947674 | * 7/2008 |
| GB | 2 389 450 A | 12/2003 |
| JP | 61148757 A | 7/1986 |
| WO | WO 2008/001030 A1 | 1/2008 |
| WO | WO 2008/120341 A1 | 10/2008 |
| WO | WO 2008/120412 A1 | 10/2008 |

OTHER PUBLICATIONS

Aptech products, http://www.kore.co.uk/aptech.htm, Kore Technology Limited 2005, 8 Pages, Aug. 3, 2009.
Swanson, et al., "Handbook of Charged Particle Optics: Chapter 1: Review of ZrO/W Schottky Cathode", Second Edition, CRC, vol. 2, Aug. 15, 2008, XP007910679, pp. 1-28, ISBN: 978-1-4200-4554-3.

* cited by examiner

*Primary Examiner* — Douglas W Owens
*Assistant Examiner* — Jonathan Cooper
(74) *Attorney, Agent, or Firm* — Muirhead and Saturnelli, LLC

(57) ABSTRACT

An electron gun used in a particle beam device, for example in an electron microscope, has a relatively good brightness and may be operated under vacuum conditions which can be easily achieved (i.e., for example, at a residual pressure of about $10^{-6}$ or $10^{-7}$ mbar). The electron gun comprises an electron source having an electron emission surface. Furthermore, the electron gun comprises a first electrode configured to control a path of electrons emitted from the electron emission surface, a second electrode which is configured to suppress emissions of electrons from a side surface of the electron source and a third electrode configured to accelerate electrons emitted from the electron source to a final energy. A first voltage, a second voltage and a third voltage are adjusted to avoid any crossover of electrons emitted from the electron emission surface.

36 Claims, 9 Drawing Sheets

ELECTRON GUN USED IN PARTICLE BEAM DEVICE

TECHNICAL FIELD

This application relates to an electron gun used in a particle beam device, for example in an electron microscope such as a scanning electron microscope (SEM) and/or a transmission electron microscope (TEM). Moreover, this application relates to an electron beam device comprising an electron gun as well as to a method for controlling an electron gun.

BACKGROUND OF THE INVENTION

It is known to use two kinds of electron sources in an electron beam device: the first kind is a thermionic source which emits electrons when heated. The second kind is a field-emission source which emits electrons when an intense electric field is applied to it.

A thermionic source uses, for example, a tungsten filament, a pointed emitter of a single crystal or a sintered compound of lanthanum hexaboride ($LaB_6$) or cerium hexaboride ($CeB_6$). If those materials are heated to a sufficiently high temperature, the electrons of the materials receive sufficient energy to overcome the natural barrier (work function). Therefore, the thermionic source is caused to emit thermally excited electrons, thereby generating an electron beam.

The design of a thermionic source can vary. It is known to use a thermionic source comprising a tip, for example a tip of a tungsten filament or a $LaB_6$ crystal comprising such a tip. Furthermore, it is also known to use a $LaB_6$ crystal in the form of a truncated cone with a polished circular disk. This disk is an electron emission surface.

When using thermionic sources like tungsten and $LaB_6$, a thermionic source is used in a triode gun. This triode gun comprises an electron source (thermionic source) in the form of a cathode, a so-called Wehnelt cylinder and an anode with an aperture in its centre. A high voltage is placed between the electron source and the anode, modified by a potential on the Wehnelt cylinder which regulates the emission current and focuses the electrons into a crossover having a diameter and convergence angle $\alpha$. Therefore, the crossover is a point at which the electrons emitted by the electron source converge.

A field-emission source operates according to a different principle than thermionic sources. The principle behind field-emission is that the strength of an electric field is considerably increased at sharp points. If the electric field is high enough, the work function barrier is sufficiently lowered for electrons to tunnel out of the material due to the tunnelling effect or the Schottky effect.

There are two types of field-emission sources, namely a cold field-emission source and a thermal field-emission source. In the case of a cold field-emission source, the end of an electron source is normally made from a single crystal fine tungsten wire and is subjected to a strong electric field at room temperature whereby electrons in the single crystal are emitted using a tunnelling effect, so that an electron beam is generated. However, to allow field-emission, the surface must be free of contaminants and oxides. This can be achieved by operating the system under relatively good vacuum conditions (for example, the residual pressure being lower than $10^{-9}$ mbar), in particular under UHV conditions (ultra high vacuum conditions). In the case of a thermal field-emission source, the electron source is heated while being subjected to a strong electric field which causes electrons to be emitted using the Schottky effect, so that an electron beam is generated. The required vacuum conditions for such an electron source are more relaxed, but still require a residual pressure lower than $10^{-8}$ mbar and, therefore, are still UHV conditions.

Both field-emission sources have to be operated under good vacuum conditions. This is a disadvantage because the time, effort and costs for providing such good conditions are relatively high. Thermal field-emission sources have a further disadvantage due to their relatively larger energy spread with respect to the electrons emitted from the electron source.

With respect to the above mentioned prior art, reference is made to GB 2 389 450 A, EP 1 947 674 A1 as well as WO 2008/001030 A1, all of which are incorporated herein by reference.

In a case where an analysis is carried out in a small region, an electron beam with a high level of brightness is required in order to reduce the diameter thereof. The brightness of an electron beam is the current density (number of electrons per unit area per unit time) per unit solid angle of an electron source. The brightness $\beta$ of an electron source is calculated by $$\beta = \frac{I_{Beam}}{\pi \cdot \alpha^2 \cdot \pi \cdot r_{\mathit{eff}}^2}, \qquad \text{[Equation 1]}$$

where $I_{Beam}$ is the beam current, $\alpha$ is the beam semi-angle (all electrons contributing to the beam current $I_{Beam}$ are emitted by the electron source within the semi-angle $\alpha$) and $r_{\mathit{eff}}$ is the effective radius of the electron source. The effective radius $r_{\mathit{eff}}$ is given by $$r_{\mathit{eff}} = \sqrt{r_0^2 + \delta r_S^2 + \delta r_C^2} \qquad \text{[Equation 2]},$$

where $r_0$ is the aberration-free radius of the electron source. $\delta r_S$ and $\delta r_C$ are the contributions of a spherical aberration ($\delta r_S$) and a chromatic aberration ($\delta r_C$). This leads to the following equation:

$$\beta = \frac{I_{Beam}}{\pi^2 \cdot \alpha^2 \cdot (r_0^2 + \delta r_S^2 + \delta r_C^2)}. \qquad \text{[Equation 3]}$$

Accordingly, it would be desirable to provide an electron gun having a relatively good brightness and which may be operated under vacuum conditions which can be easily achieved (i.e., for example, at a residual pressure of about $10^{-6}$ or $10^{-7}$ mbar). Moreover, it would also be desirable to provide an electron beam device with such an electron gun as well as a method for controlling such an electron gun.

SUMMARY OF THE INVENTION

An electron gun according to the system described herein comprises at least one electron source. This at least one electron source has an electron emission surface configured to emit electrons which are used to form an electron beam. Furthermore, the electron gun may include at least one first electrode configured to control a path of electrons emitted from the electron emission surface. The first electrode may be located at a given distance to the electron source and may comprise a first side and a second side, the first side and the second side being opposite to each other. Furthermore, the electron gun may include a second electrode which is configured to suppress emissions of electrons from a side surface of the electron source. This ensures that electrons are emitted from the electron emission surface only. The electron gun may also include at least one third electrode configured to accelerate electrons emitted from the electron source to a final energy. The first side of the first electrode may face the second electrode, whereas the second side of the first electrode may face the third electrode. Therefore, the first electrode may be located between the second electrode and the third electrode.

Moreover, the first electrode has a first electrode potential. A first voltage is a first potential difference between the first electrode potential of the first electrode and an electron source potential of the electron source. The first voltage may be adjustable to at least a first value and a second value. The second electrode has a second electrode potential. A second voltage is a second potential difference between the second electrode potential of the second electrode and the electron source potential of the electron source. The second voltage may be adjustable to at least a third value and a fourth value. Additionally, the third electrode has a third electrode potential. A third voltage is a third potential difference between the third electrode potential of the third electrode and the electron source potential of the electron source. The third voltage may be adjustable to at least a fifth value and a sixth value. Thus, the first, second and third voltages are variable. They can be adjusted to certain values and are not fixed to one specific value. The first voltage, the second voltage and the third voltage may be adjusted to avoid any crossover of electrons emitted from the electron emission surface. As mentioned above, the crossover is a point at which the electrons emitted by the electron source converge. There may be only a virtual crossover which is formed somewhere in the electron source. The virtual crossover may have a fixed position.

The system described herein allows the use of a thermionic source as the electron source. Since a thermionic source may normally have a larger size than a field-emission source, the vacuum conditions required for operating the electron gun may not be as high as UHV conditions. The electron gun according to the system described herein may be operated with a residual pressure of about $10^{-5}$ mbar (for example, for a tungsten filament as the electron source) to $10^{-7}$ mbar (for example, for a rare earth hexaboride as the electron source). These vacuum conditions are relatively easy to achieve. Moreover, the voltage between the electron source and the first electrode can be adjusted to relatively low values. These low values and the relatively large size of the electron source yield an electric field strength at the electron source (for example $10^7$ V/m) which is well below the electric field strength required for field emission (for example $>5\times10^8$ V/m).

Furthermore, the brightness $\beta$ of the electron gun according to the system described herein may be relatively high. The first electrode, which may be configured to control a path of electrons emitted from the electron emission surface, increases the strength of the electric field near the electron emission surface. This results in a decrease of a negative space charge in the area of the electron emission surface. This, in turn, results in a higher acceleration of electrons emitted from the electron emission surface towards the third electrode. This again results in a lower energy spread of the electrons emitted from the electron emission surface and lowers the chromatic aberration $\delta r_C$. Stochastic Coulomb interactions between electrons (known as Boersch effects) increase the chromatic aberration $\delta r_C$, especially at a crossover where the electrons are rather close to each other. Since the first voltage, the second voltage and the third voltage can be adjusted to receive no crossover of electrons, the chromatic aberration $\delta r_C$ is reduced. Moreover, the effective radius $r_{eff}$ of the electron source can be reduced due to the low chromatic aberration $\delta r_C$. Since these values are comprised in the denominator of Equation 3, the brightness $\beta$ of the electron gun according to the system described herein is relatively high.

According to the prior art, an emission current in the range of a few µA (for example 1 µA to 5 µA) which is transferred via the first electrode was achieved. Therefore, a power supply unit capable of providing such an emission current was used. The system described herein, however, also facilitates a high emission current in the range of a few mA (for example 1 mA to 5 mA) which is transferred via the first electrode. Therefore, at least one power supply unit capable of providing such an emission current in the range of a few mA may be used for the system described herein.

In an embodiment of the system described herein, the first electrode potential may be positive relative to the electron source potential, and the second electrode potential may be negative relative to the electron source potential. Moreover, the third electrode potential may be positive relative to the electron source potential. In an alternative embodiment, the third electrode potential may be at earth potential (0 V). Moreover, the first electrode potential may be positive or negative relative to the third electrode potential. The first electrode potential can be positive if the third voltage is less than 1.5 kV. The second electrode potential may be negative relative to the third electrode potential.

An embodiment of the electron gun according to the system described herein comprises one of the following features: the first voltage, the second voltage and the third voltage may be configured to avoid a crossover of electrons emitted from the electron emission surface in an area between the electron source and the third electrode; or the first voltage, the second voltage and the third voltage may be configured to avoid a crossover of electrons emitted from the electron emission surface in a first path area between the electron source and a second path area on a side of the third electrode, which is directed towards an opposite direction with respect to the second side of the first electrode.

This means that no crossover of electrons emitted from the electron emission surface occurs in any area of the electron gun. In particular, the path of the electrons passing the third electrode in the direction opposite to the electron source (for example along an optical axis of a particle beam device) diverges. If the electron gun is used in a particle beam device comprising an electromagnetic and/or electrostatic guiding unit (for example, a condenser), the crossover occurs after the electrons have passed the guiding unit.

In a further embodiment of the electron gun according to the system described herein, the electron source may be made of one of the following materials: a rare earth hexaboride, preferably lanthanum hexaboride ($LaB_6$) or cerium hexaboride ($CeB_6$), or tungsten (W).

Furthermore, in one embodiment of the electron gun according to the system described herein, the electron source may be formed as an axially symmetric truncated cone. The electron emission surface may be oriented towards the first electrode. Therefore, electrons emitted from the electron emission surface are directed to the first electrode. Alternatively or additionally, the electron emission surface may have a diameter in the range of 5 µm to 200 µm, preferably 20 µm to 120 µm.

In a further embodiment of the electron gun according to the system described herein, the electron source may comprise a first end and a second end. Furthermore, the second electrode may include an aperture. The first end of the electron source may protrude through the aperture of the second electrode. As mentioned above, the second electrode may be configured to suppress emissions of electrons from a side surface of the electron source. Alternatively or additionally, the first electrode and the second electrode may be mounted at a distance from each other in the range of 0.05 mm to 0.5 mm, preferably 0.2 mm to 0.3 mm. It has been found that such an arrangement makes sure that no field-emission and no crossover will occur.

In a further embodiment of the electron gun according to the system described herein, the first electrode and the second electrode may be mounted at a distance from each other in the range of 0.3 mm to 1.2 mm, preferably 0.5 mm to 0.6 mm.

Alternatively or additionally, the electron gun according to the system described herein may have at least one of the following features: the first electrode and the third electrode are mounted at a distance from each other in the range of 3 mm to 6 mm, preferably 3.5 mm to 5.5 mm; and/or the third electrode comprises an aperture having a diameter in the range of 0.8 mm to 3.0 mm.

In a further embodiment of the electron gun according to the system described herein, the electron gun may comprise at least one of the following features: the first electrode potential is in the range of 100 V to 1500 V, preferably in the range of 300 V to 900 V, with respect to the electron source potential; the second electrode potential is in the range of (−100) V to (−1) kV, preferably in the range of (−300) V to (−700) V, with respect to the electron source potential; and/or the third electrode potential is in the range of 100 V to 30 kV, preferably 300 V to 15 kV with respect to the electron source potential.

In a further embodiment, if the third electrode potential is at earth potential (0 V), the second electrode and the electron source have corresponding higher negative potentials. Moreover, the first electrode potential can be positive or negative relative to the third electrode potential of the third electrode. For example, the first electrode potential of the first electrode may be in the range of 1.4 kV to (−29.9) kV, preferably in the range of 1.2 kV to (−14.9) kV. The first electrode potential of the first electrode can be positive if the third voltage (as defined above) is less than 1.5 kV. The second electrode potential of the second electrode may be in the range of (−200) V to (−31) kV, preferably in the range of (−400) V to (−16) kV. For example, the third electrode potential may be at earth potential, the electron source potential of the electron source may be (−30) kV, the first electrode potential of the first electrode is (−29.3) kV and the second electrode potential of the second electrode may be (−30.6) kV. Thus, the first voltage may be 700 V, the second voltage may be (−600) V and the third voltage may be 30 kV.

Surprisingly, simulations revealed that a linear relationship exists between the first electrode potential and the second electrode potential in relation to a given third electrode potential. As shown further below, this relationship can be shown graphically via a line dividing two areas of values of the first electrode potential and the second electrode potential. In a first area, there exist only pairs of values of the first electrode potential and the second electrode potential for which a crossover occurs (a so-called real crossover). However, in a second area, there exist only pairs of values of the first electrode potential and the second electrode potential for which no crossover occurs as explained above.

Another embodiment of the electron gun according to the system described herein comprises an axial electric field which exists at the electron emission surface. The axial electric field has an axial electric field strength $E_{Field}$ which does not result in field-emission. In particular, the axial electric field strength $E_{Field}$ may fulfil the following equation:

$$1 \times 10^5 \frac{V}{m} \leq E_{Field} \leq 5 \times 10^7 \frac{V}{m}. \qquad \text{[Equation 4]}$$

An electron beam device according to the system described herein may include an electron gun having at least one of the above mentioned features. The electron gun may generate an electron beam. Furthermore, the electron beam device may comprise an objective lens. The objective lens focuses the electron beam on an object. Moreover, the electron beam device may include at least one detector for detecting interaction resulting from the focussing of the electron beam on an object.

A method for controlling an electron gun as mentioned above may comprise the following steps: applying the first voltage to the first electrode; applying the second voltage to the second electrode; and applying the third voltage to the third electrode, and in which applying the first voltage, the second voltage and the third voltage is carried out such that a crossover of electrons emitted from the electron source is avoided.

A further embodiment of the method according to the system described herein may comprise one of the following steps: the applying the first voltage, the second voltage and the third voltage is configured to avoid a crossover of electrons emitted from the electron emission surface in an area between the electron source and the third electrode; or the applying the first voltage, the second voltage and the third voltage is carried out such that a crossover of electrons emitted from the electron emission surface is avoided in a first path area between the electron source and a second path area on a side of the third electrode, which is directed towards an opposite direction with respect to the second side of the first electrode.

In another embodiment of the method according to the system described herein, the method may comprise at least one of the following steps: the applying the first voltage comprises applying the first electrode potential in the range of 100 V to 1500 V, preferably in the range of 300 V to 900 V, relative to the electron source potential; the applying the second voltage comprises applying the second electrode potential in the range of (−100) V to (−1) kV, preferably in the range of (−300) V to (−700) V, relative to the electron source potential; or the applying the third voltage comprises applying the third electrode potential in the range of 100 V to 30 kV, preferably 300 V to 15 kV, relative to the electron source potential.

In another embodiment of the method according to the system described herein, the method may comprise at least one of the following steps: the applying the third voltage comprises applying the third electrode potential of the third electrode at earth potential; providing the electron source potential of the electron source, wherein the electrode source potential is in the range of (−100) V to (−30 kV), preferably in the range of (−300) V to (−15) kV with respect to the third electrode potential; the applying the first voltage comprises applying the first electrode potential of the first electrode in the range of 1.4 kV to (−29.9) kV, preferably in the range of 1.2 kV to (−14.9) kV, with respect to the third electrode potential; or the applying the second voltage comprises applying the second electrode potential of the second electrode in the range of (−200) V to (−31) kV, preferably in the range of (−400) V to (−16) kV, with respect to the third electrode potential.

BRIEF DESCRIPTION OF THE DRAWINGS

The system described herein will now be further explained based on embodiments shown in the accompanying figures that are briefly described as follows.

DETAILED DESCRIPTION OF VARIOUS EMBODIMENTS

The system described herein will now be further explained with respect to particle beam devices, in particular to two electron beam devices. It should be noted that the system described herein is not limited to these electron beam devices, and instead may be arranged and/or used in any suitable particle beam device.

Figure 1:
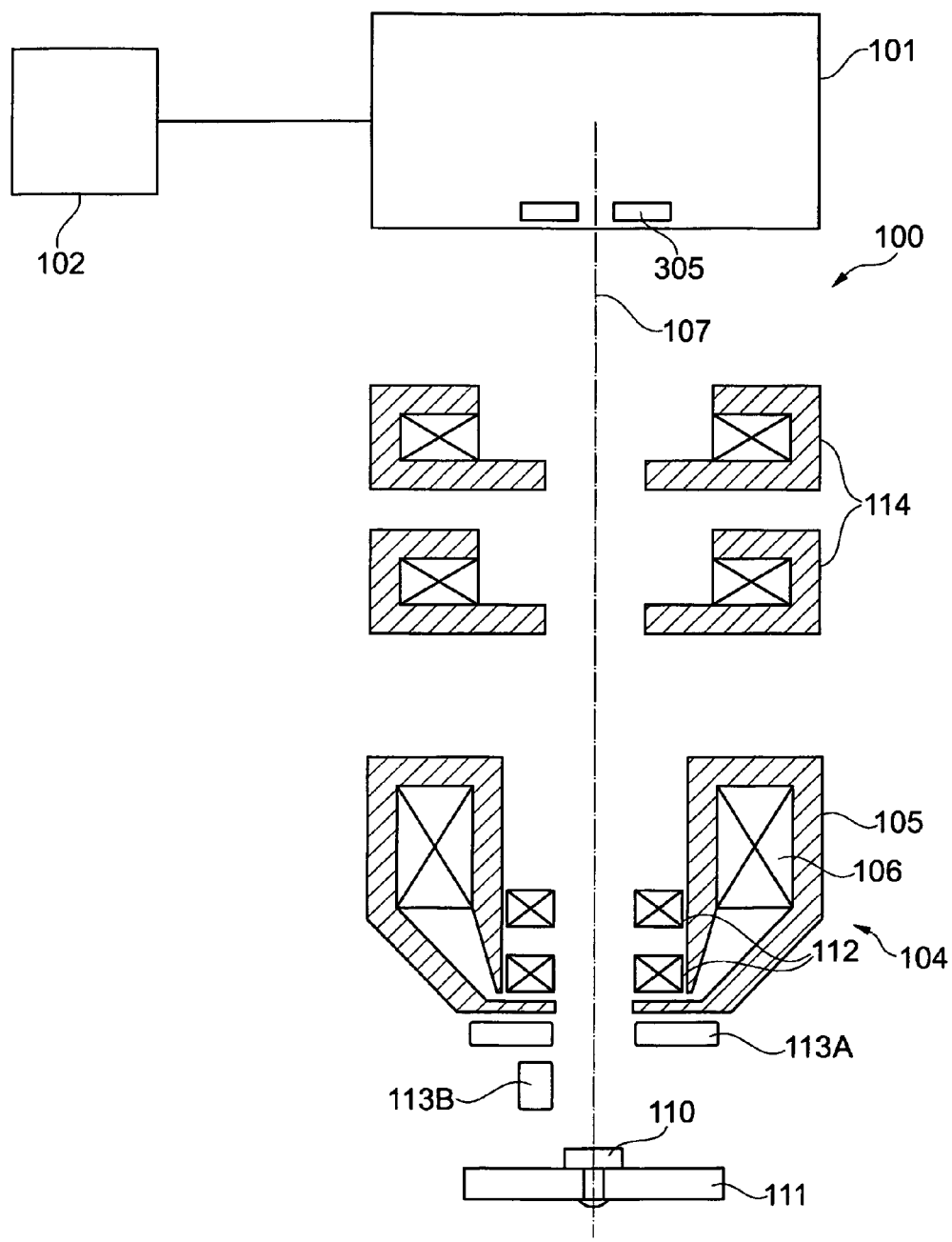
FIG. 1 shows a schematic view of a scanning electron microscope (SEM) according to an embodiment of the system described herein.

FIG. 1 shows a schematic drawing of a scanning electron microscope 100 (hereinafter referred to as SEM) according to an embodiment of the system described herein. The SEM 100 may comprise an electron gun 101 providing electrons. The electron gun 101 may be connected to a supply unit 102 which supplies high voltages to the electron gun 101. The electron gun 101 and the supply unit 102 will be described in detail below.

The SEM 100 may also comprise a condenser 114 and an objective lens 104 in the direction of the optical axis 107 of the SEM 100, starting from the electron gun 101. The objective lens 104 may comprise pole shoes 105 having coils 106. A sample 110 may be arranged on a holding element 111. Additionally, the SEM 100 may comprise a scanning device 112 which enables scanning of the electrons over the sample 110.

The SEM 100 may also comprise detectors 113A and 113B which detect electrons resulting from an interaction of the electrons scanned over the sample 110. The detected electrons may be backscattered electrons (BSE) and/or secondary electrons (SE). The detectors 113A and 113B may be used for providing an image of the sample 110.

Figure 2:
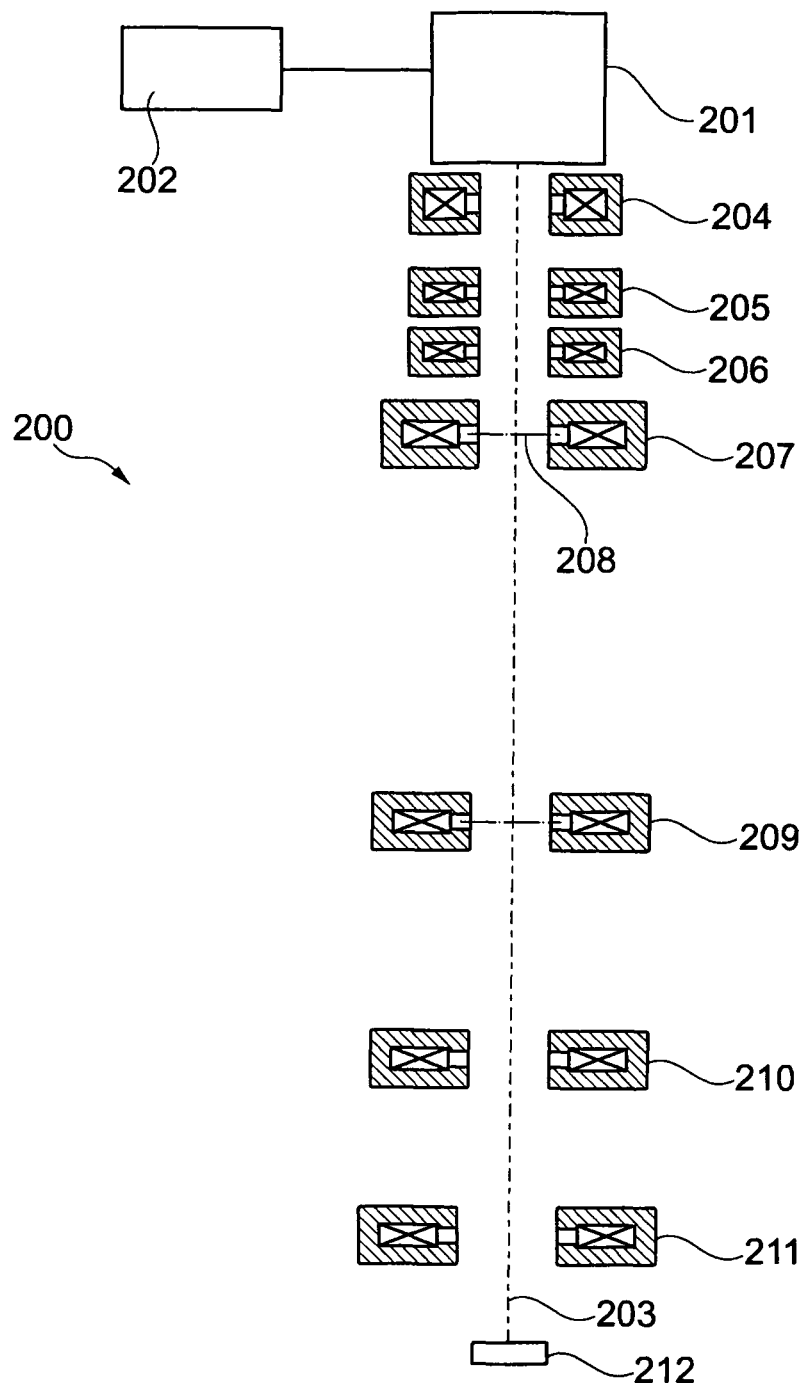
FIG. 2 shows a schematic view of a transmission electron microscope (TEM) according to an embodiment of the system described herein.

FIG. 2 shows another example of a beam device having a holding element for a sample to be examined according to another embodiment of the system described herein. This beam device may be a transmission electron microscope 200 (hereinafter referred to as TEM). The TEM 200 may comprise an electron gun 201 which is connected to a supply unit 202 which supplies high voltages to the electron gun 201. The electron gun 201 and the supply unit 202 will be described in detail below and may be configured substantially identically to the electron gun 101 and the supply unit 102, respectively, of the SEM 100.

In the direction of the optical axis 203, the TEM 200 may also comprise a multi-stage condenser having a first magnetic lens 204, a second magnetic lens 205 and a third magnetic lens 206 followed by an objective lens 207. The objective lens 207 may comprise a sample plane 208 in which the holding element is arranged. The TEM 200 may also comprise a fourth magnetic lens 209 and a projective system which comprises a first projective lens 210 and a second projective lens 211. The projective system may provide an image on a detector 212.

Figure 3A:
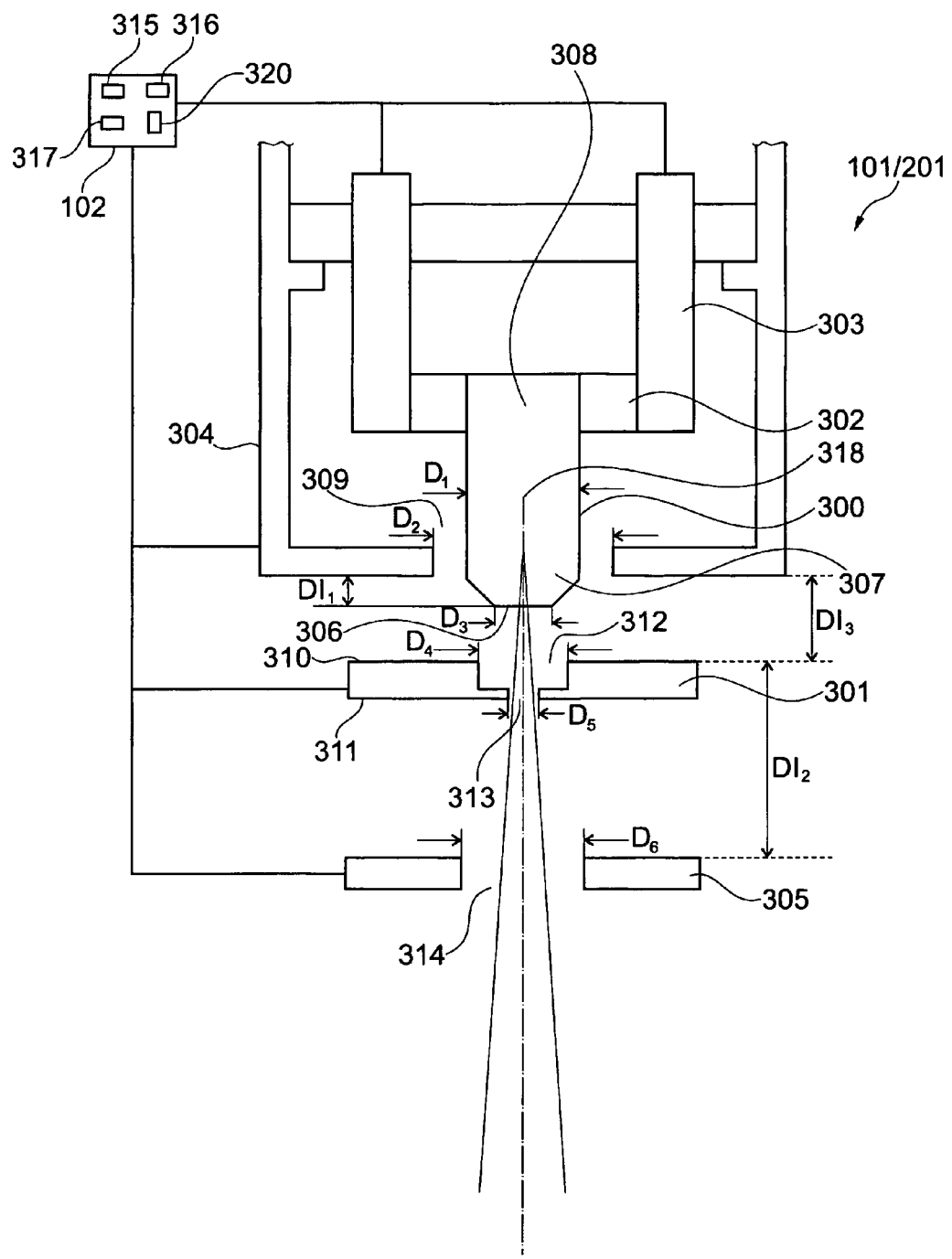
FIGS. 3A and B show electron guns used in the scanning electron microscope of FIG. 1 and/or in the transmission electron microscope of FIG. 2.

FIG. 3A shows a schematic view of the electron gun 101 of the SEM 100. The electron gun 201 of the TEM 200 may be substantially identically configured. The electron gun 101 may be a thermionic source. The electron gun 101 may comprise an electron source 300, a first electrode in the form of a control electrode 301, a heat generator 302 for heating the electron source 300 and which is located on the sides of the electron source 300, a holder 303 for holding the electron source 300 and the heat generator 302, a second electrode in the form of a suppressor electrode 304 and a third electrode in the form of an acceleration electrode 305 (also called an anode). FIG. 1 shows the position of the acceleration electrode 305 in the SEM 100. Electrons provided by the electron source 300 are guided along the optical axis 107 with an energy which is caused by the potential difference between the electron source 300 and the acceleration electrode 305.

The heat generator 302 may be connected to the supply unit 102 and may be operated by the supply unit 102 via a power supply 320. As will be explained in further details below, the control electrode 301, the suppressor electrode 304 and the acceleration electrode 305 may have specific potentials with respect to the electron source potential. In a further embodiment (shown in FIG. 3B and explained further below), it is possible to operate the heat generator 302 such that the electron source 300 has a high negative potential. This means that the electron source 300 and the suppressor electrode 304 are floating at a high negative potential. The acceleration electrode 305 may be at earth potential (0 V).

The electron source 300 may be made of a rare earth hexaboride, preferably lanthanum hexaboride ($LaB_6$) or cerium hexaboride ($CeB_6$). Alternatively, the electron source 300 may be made of tungsten (W). Furthermore, the electron source 300 may be formed as an axially symmetric truncated cone having a first diameter $D_1$ of about 100 µm to 500 µm and comprise an electron emission surface 306 which is oriented towards the control electrode 301. The electron emission surface 306 may have a third diameter $D_3$ in the range of 5 µm to 200 µm, preferably 20 µm to 120 µm.

The suppressor electrode 304 may comprise an aperture 309 having a second diameter $D_2$ of approximately 1 mm. The electron source 300 may comprise a first end 307 and a second end 308. The first end 307 may protrude through the aperture 309. The electron emission surface 306 on the first end 307 and the suppressor electrode 304 may be mounted at a first distance $DI_1$ from each other in the range of 0.05 mm to 0.5 mm, preferably 0.2 mm to 0.3 mm.

The control electrode 301 may comprise a first side 310 and a second side 311. The first side 310 may be directed towards the suppressor electrode 304, whereas the second side 311 may be directed towards the acceleration electrode 305. Therefore, the control electrode 301 may be arranged between the suppressor electrode 304 and the acceleration electrode 305. Moreover, the control electrode 301 and the acceleration electrode 305 may be mounted at a second distance $DI_2$ from each other in the range of 3 mm to 6 mm, preferably 3.5 mm to 5.5 mm. Furthermore, the control electrode 301 and the suppressor electrode 304 may be mounted at a third distance $DI_3$ from each other in the range of approximately 0.3 mm to 1.2 mm, for example 0.6 mm.

The first side 310 of the control electrode 301 may comprise a first recess 312 and the second side 311 of the control electrode 301 may comprise a second recess 313. The first recess 312 and the second recess 313 may be connected to each other. The first recess 312 may have a fourth diameter $D_4$ of approximately 400 µm. The second recess 313 may have a fifth diameter $D_5$ of approximately 50 µm.

The acceleration electrode 305 may comprise an aperture 314 having a sixth diameter $D_6$ in the range of 0.8 mm to 3.0 mm, for example 1.2 mm.

All above mentioned dimensions, in particular distances and diameters are given as examples only. It is to be understood that any appropriate dimension may be chosen which might be used for carrying out the system described herein.

In the embodiment of FIG. 3A, the supply unit 102 may comprise three voltage supply units, namely a first voltage supply unit 315, a second voltage supply unit 316 and a third voltage supply unit 317. The first voltage supply unit 315 applies a first voltage to the control electrode 301. The first voltage may be applied such that the first electrode potential of the control electrode 301 is positive with respect to the electron source potential of the electron source 300. The first electrode potential of the control electrode 301 may be in the range of 100 V to 1500 V, preferably in the range of 300 V to 900 V, for example 700 V with respect to the electron source potential (which is, for example, 0 V). The second voltage supply unit 316 may apply a second voltage to the suppressor electrode 304 such that the second electrode potential of the suppressor electrode 304 is negative relative to the electron source potential of the electron source 300. In particular, the second electrode potential may be in the range of (−100) V to (−1) kV, preferably in the range of (−300) V to (−800) V, for example (−600) V. The third voltage supply unit 317 may apply a third voltage to the acceleration electrode 305 such that the third electrode potential of the acceleration electrode 305 is positive relative to the electron source potential of the electron source 300. In this embodiment, the third electrode potential may be in the range of 100 V to 30 kV, preferably 300 V to 15 kV.

The first voltage, the second voltage and the third voltage may be adjustable to at least two values. Thus, the first voltage, the second voltage and the third voltage are variable. They can be adjusted to certain values and are not fixed to one specific value to avoid a crossover under different beam energies (see also FIGS. 6B and 7B).

Figure 3B:
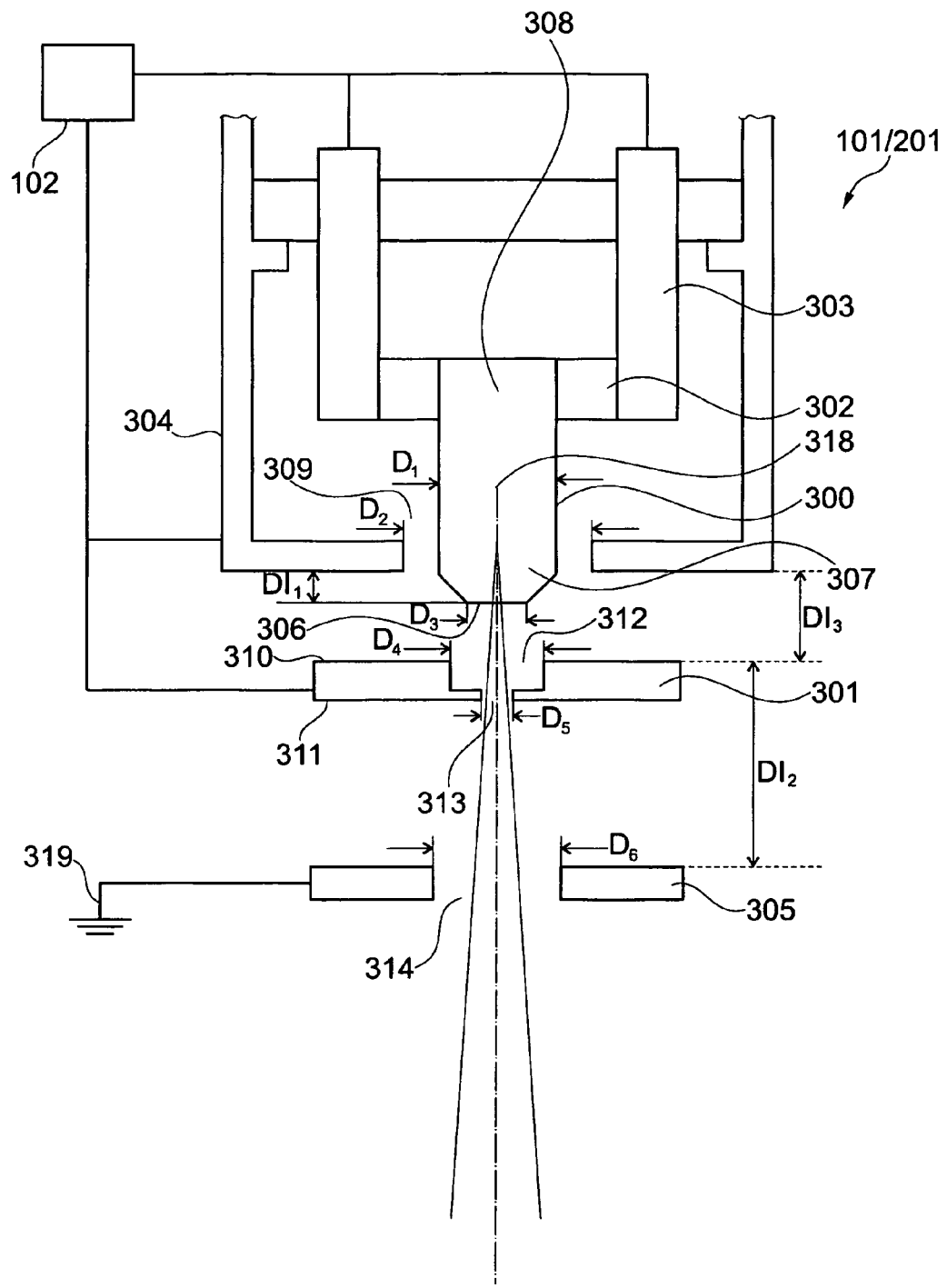

FIG. 3B shows a schematic view of another embodiment of the electron gun 101 of the SEM 100. This embodiment is substantially similar to the embodiment of FIG. 3A. However, the acceleration electrode 305 may be at earth potential and, therefore, may be connected to an earth potential connection point 319. The second electrode potential of the suppressor electrode 304 and the electron source potential of the electron source 300 may be negative with respect to the third electrode potential of the acceleration electrode 305. The first electrode potential of the control electrode 301 can be positive or negative with respect to the third electrode potential of the acceleration electrode 305. The first electrode potential of the control electrode 301 may be in the range of 1.4 kV to (−29.9) kV, preferably in the range of 1.2 kV to (−14.9) kV. The second electrode potential of the suppressor electrode 304 may be in the range of (−200) V to (−31) kV, or in the range of (−400) V to (−16) kV. The electron source potential of the electron source 300 may be in the range of (−100) V to (−30) kV, for example (−30) kV. For (−30) kV, electrons have an energy of about 30 keV if the sample 110 to which the electrons are provided is also at earth potential. For example, the electron source potential of the electron source 300 may be (−30) kV, the first electrode potential of the control electrode 301 may be (−29.3) kV and the second electrode potential of the suppressor electrode 304 may be (−30.6) kV. Thus, the first voltage may be 700 V, the second voltage may be (−600 V) and the third voltage may be 30 kV. The first electrode potential of the control electrode 301 can be positive if the third voltage is less than 1.5 kV.

The first voltage, the second voltage and the third voltage may be configured to avoid any crossover of electrons emitted from the electron emission surface 306. A virtual crossover 318 may be formed somewhere in the electron source 300. The virtual crossover 318 may have a fixed position. Thus, there is no crossover of electrons emitted from the electron emission surface 306 occurring in any area of the electron gun. In particular when switching the electron energy, for example from 100 eV to 30 keV, no crossover will occur. Moreover, the path of the electrons passing the acceleration electrode 305 in the direction opposite to the electron source 300 diverges. In the SEM 100, the crossover may occur after the electrons have passed the condenser 114. In the TEM 200, the crossover may also occur after the electrons have passed at least one of the first magnetic lens 204, the second magnetic lens 205 or the third magnetic lens 206.

The first voltage, the second voltage and the third voltage may be selected such that an axial electric field at the electron emission surface 306 does not result in field-emission. Therefore, the electron gun 101 can be operated under vacuum conditions (for example, at a residual pressure of about $10^{-6}$ mbar to $10^{-7}$ mbar) which are relatively easy to achieve.

Furthermore, the brightness β of the electron gun 101 may be relatively high. The control electrode 301 which is configured to control a path of electrons emitted from the electron emission surface 306 may increase the strength of the electric field near the electron emission surface 306. In the embodiments according to FIGS. 3A and 3B, the axial electric field strength $E_{Field}$ fulfills the Equation 4 as mentioned above. This results in an acceleration of electrons emitted from the electron emission surface 306 towards the acceleration electrode 305. This again results in a lower energy spread of the electrons emitted from the electron emission surface 306 and lowers the chromatic aberration $\delta r_C$. Since the first voltage, the second voltage and the third voltage can be configured to receive no crossover of electrons, the effective radius $r_{eff}$ of the virtual crossover 318 can be minimized due to the low chromatic aberration $\delta r_C$. As can be seen in Equation 3, where these values appear in the denominator, these values being low results in the brightness β of the electron gun 101 according to the system described herein being relatively high.

Figure 4:
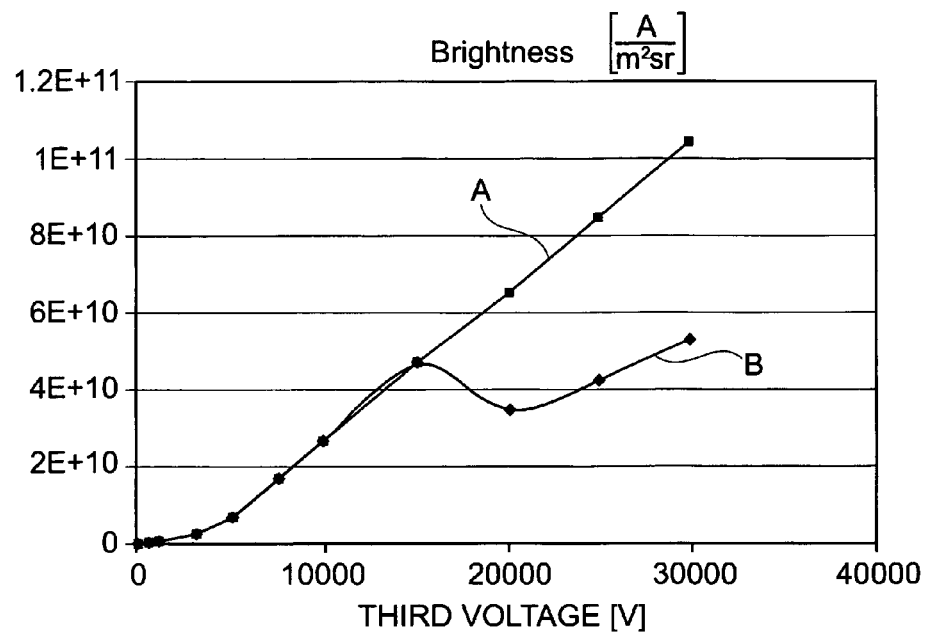
FIG. 4 shows the calculated brightness of the electron guns of FIGS. 3A and 3B.
Figure 5:
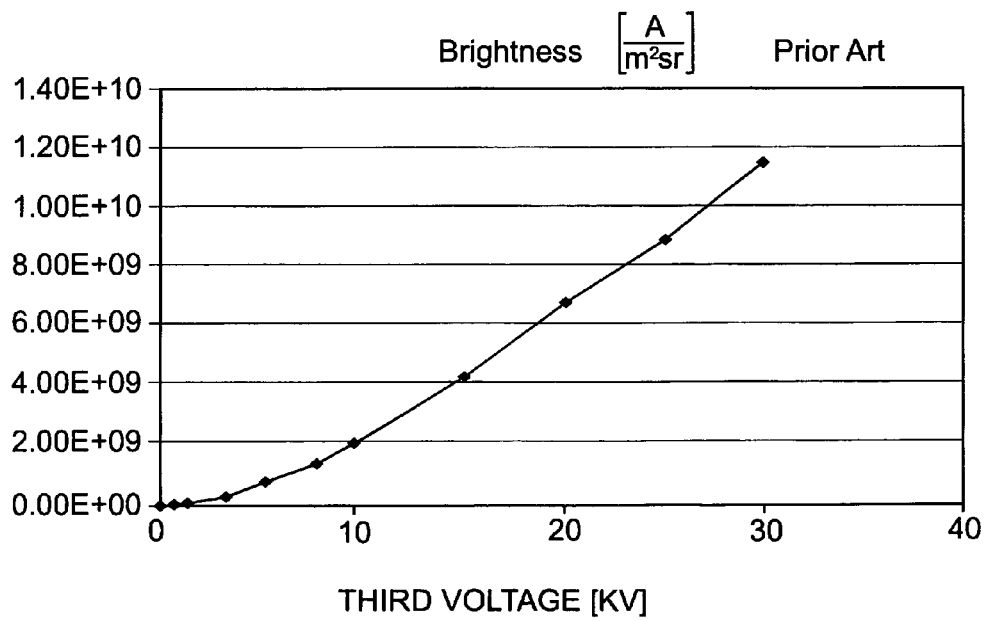
FIG. 5 shows the brightness of an electron gun according to the prior art.

FIG. 4 shows the calculated brightness depending on the third voltage of the electron gun 101 according to FIGS. 3A and 3B, using $LaB_6$ as the electron source 300, whereas FIG. 5 shows the brightness depending on the third voltage of an electron gun according to the prior art using $LaB_6$ as an electron source. The third voltage is the potential difference between the electron source potential of the electron source 300 and the third electrode potential of the acceleration electrode 305. As can be seen from a comparison of FIG. 4 and FIG. 5, the brightness of the electron gun 101 according to the system described herein for third voltages in the range of approximately 300 V to 15 kV is much higher than the brightness of the electron gun according to the prior art. For example, the brightness of the electron gun 101 may be 2.5×

$10^{10}$ A/m²sr for a third voltage of 10 kV, whereas the brightness of the electron gun according to the prior art may be $2 \times 10^9$ A/m²sr for a third voltage of 10 kV.

Moreover, FIG. 4 shows two curves, namely curve A and curve B. The curves A and B proceed more or less identically up to a value of the third voltage of about 15 kV. After that value, curve A increases more or less linearly whereas curve B first decreases and increases again with a rather small inclination. Curve A shows the brightness which theoretically is achieved if no crossover occurs. This may be achieved by altering the first electrode potential of the control electrode 301 and the second electrode potential of the suppressor electrode 304 (see FIGS. 6B and 7B). Curve B shows the brightness which theoretically is achieved by applying a fixed value of 700 V to the control electrode 301 and a fixed value of −600 V to the suppressor electrode 304. Therefore, the brightness decreases and might proceed as shown with curve B. If the potentials of the electron source 300, the control electrode 301, the suppressor electrode 304 and the acceleration electrode 305 are chosen as it would be done for a field-emission source according to the prior art, a crossover would even occur for quite low values of the third voltage of the acceleration electrode 305. Accordingly, it is significant that no crossover occurs. This can be achieved by a suitable first electrode potential of the control electrode 301 and suitable second electrode potential of the suppressor electrode 304 when a specific value of the third electrode potential of the acceleration electrode 305 is given.

Figure 6A:
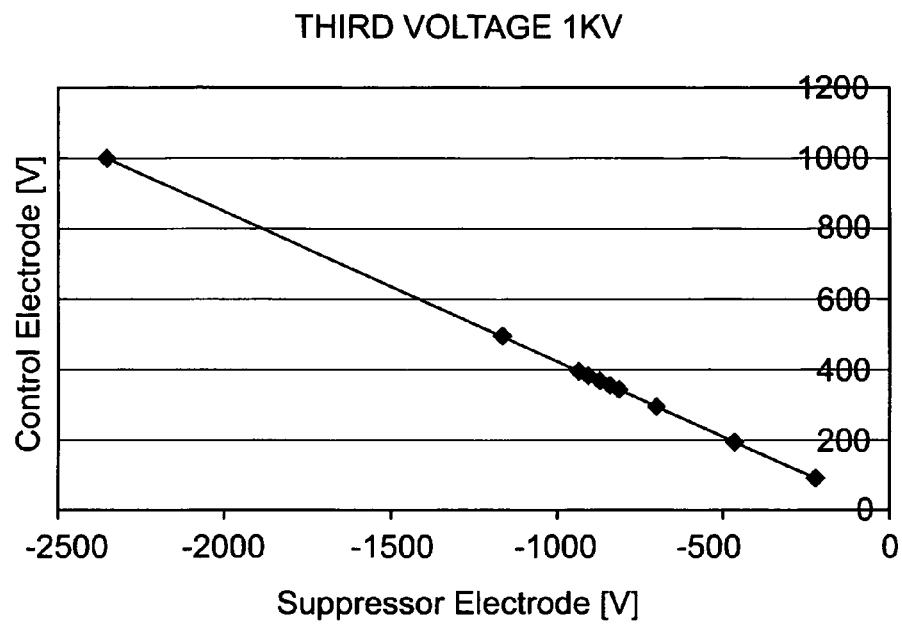
FIGS. 6A and 6B are graphs showing the dependency of the voltage of the control electrode from the voltage of the suppressor electrode for the simultaneously fulfilled requirements of a third voltage of 1 kV and a collimated electron beam at the acceleration electrode according to an embodiment of the system described herein.
Figure 6B:
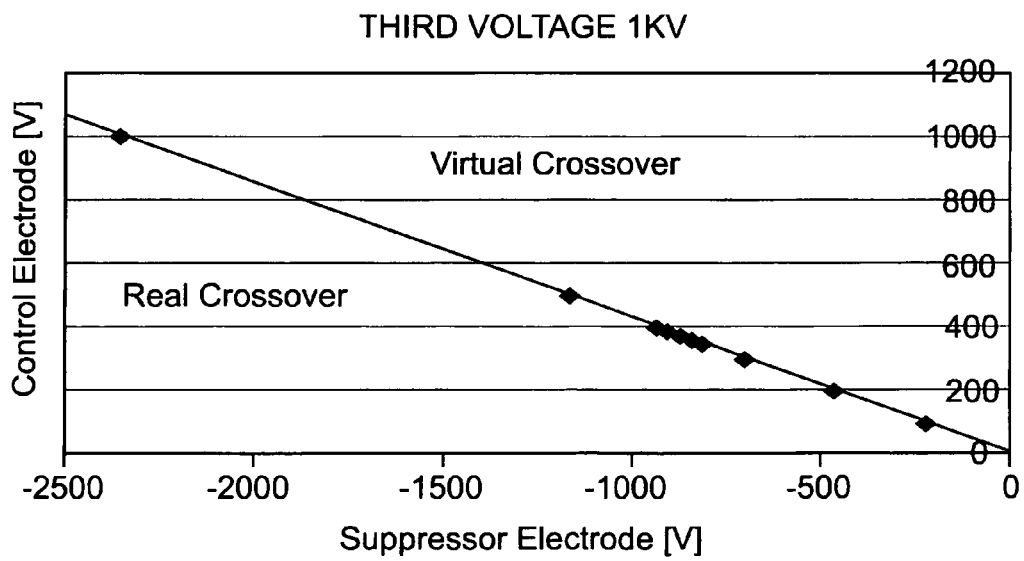
Figure 7A:
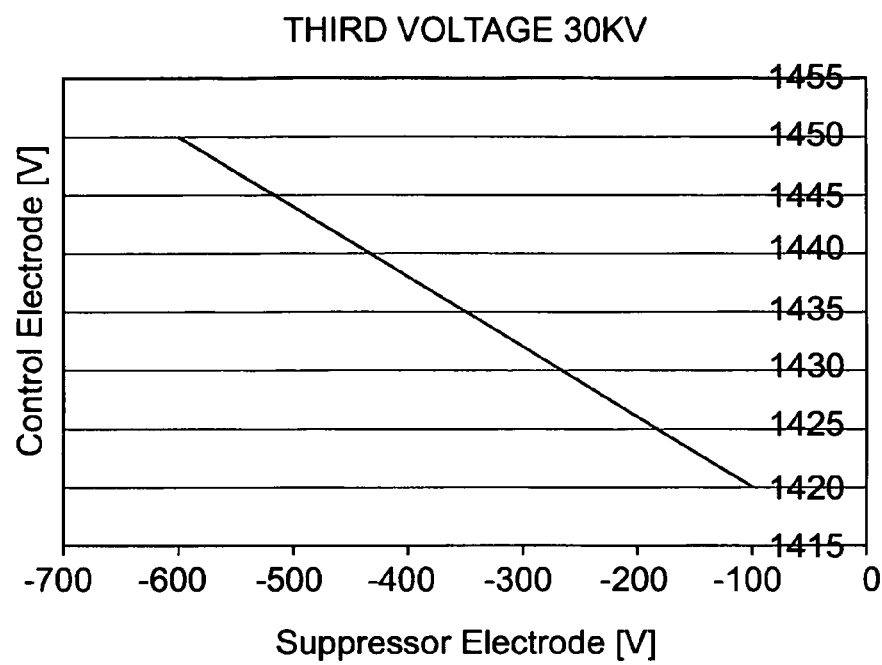
FIGS. 7A and 7B are graphs showing the dependency of the voltage of the control electrode from the voltage of the suppressor electrode for the simultaneously fulfilled requirements of a third voltage of 30 kV and a collimated electron beam at the acceleration electrode according to an embodiment of the system described herein.
Figure 7B:
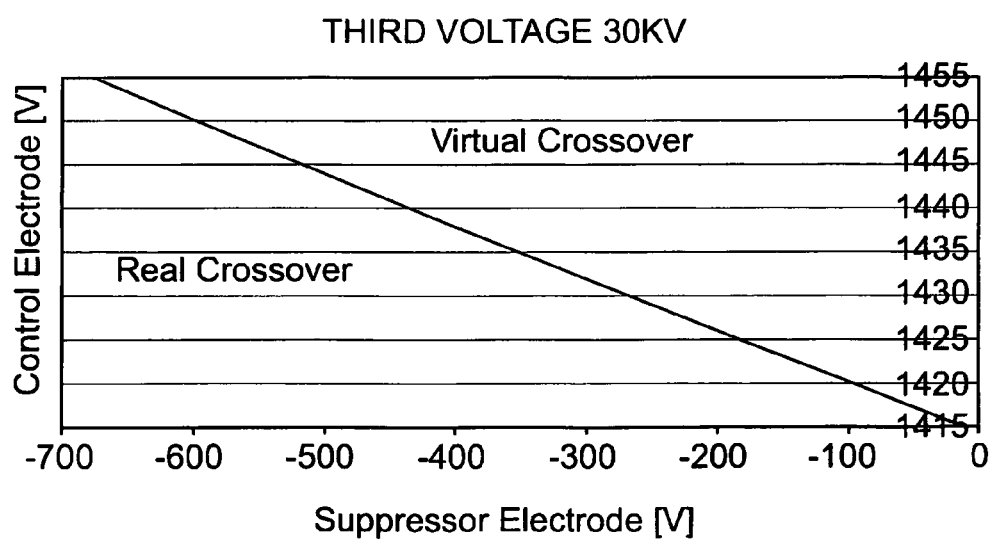

Surprisingly, simulations revealed that a linear relationship exists between the first electrode potential and the second electrode potential for each fixed third electrode potential and for the further requirement that downstream of the acceleration electrode 305 the electron beam is collimated. FIGS. 6A, 6B, 7A and 7B show these linear relationship, whereby FIGS. 6A and 6B show this linear relationship for a third voltage of 1 kV which is equal to the potential difference between the third electrode potential of the acceleration electrode 305 and the electron source potential of the electron source 300, and whereby FIGS. 7A and 7B show this linear relationship for a third voltage of 30 kV which is equal to the potential difference between the third electrode potential of the acceleration electrode 305 and the electron source potential of the electron source 300. This may correspond to an electron energy of 1 keV or 30 keV at the sample 110, respectively. It is noted that the system described herein is not restricted to these electron energies. There exist arbitrary other electron energies in the range between 100 eV and 30 keV not shown which show a similar relationship as explained below for 1 keV and 30 keV.

The straight lines in FIGS. 6A and 7A are defined by values for the first voltage and second voltage which result in a parallel beam of electrons passing the acceleration electrode 305 (or downstream of the acceleration electrode 305). This means that if the first voltage and the second voltage are adjusted according to the coordinate values of any point on the straight line in FIG. 6A, and under the further prerequisite that the third voltage is adjusted to 1 kV, a collimated electron beam will result downstream of the acceleration electrode 305; and the same is true when the first voltage and the second voltage are adjusted according to the coordinate values of any point on the straight line in FIG. 7A under the prerequisite that the third voltage is adjusted to 30 kV. Therefore, neither a real crossover nor a virtual crossover occurs for the pairs of voltage values for the first electrode (marked as "control electrode") and for the second electrode (marked as "suppressor electrode") defined by the straight lines in the graphs in FIGS. 6A and 7A. The straight lines in FIGS. 6A and 7A thereby define border lines between two areas, namely a first area in which a real crossover occurs and a second area in which a virtual crossover occurs. These two areas are marked in FIGS. 6B and 7B, which correspond to FIGS. 6A and 7A, respectively, by "Virtual Crossover"—above the straight line—and "Real Crossover"—below the straight line.

For all points in the areas marked "Virtual Crossover", i.e. for all pairs of voltages for the control electrode 301 and the suppressor electrode 304 which correspond to the coordinate values of any point in the area marked "Virtual Crossover", the electron beam generated by the electron gun 101/201 will not have any real crossover between the electron source 300 and a first lens or other beam focussing device following downstream of the acceleration electrode 305. Therefore, for all adjustments of the voltage of the control electrode 301 and the voltage of the suppressor electrode 304 which correspond to the coordinate values of any point either on the straight line or in the area marked as "Virtual Crossover", the electron gun 101/201 will have a higher brightness than for adjustments of the voltage of the control electrode 301 and the voltage of the suppressor electrode 304 which correspond to the coordinate values of any point in the area marked as "Real Crossover".

As indicated already above, similar graphs can be calculated also for arbitrary acceleration voltages in the range between 100 V and 30 kV so that for any desired electron energy downstream of the acceleration electrode 305 pairs of voltage values for the control electrode 301 and the suppressor electrode 304 can be found to ensure a divergent or parallel electron beam downstream of the acceleration electrode 305 and therefore ensuring a high brightness of the electron gun 101/201.

In an embodiment of an electron microscope with a respective electron gun 101/201 for each possibly adjustable electron energy at the sample 110, the respective pair of voltage values for the control electrode 301 and the suppressor electrode 304 can be stored in an memory of the control system. If later the electron energy is adjusted to a respective defined value, the corresponding voltage values for the control electrode 301 and the suppressor electrode 304 can be read-out from the memory and the voltages of the control electrode 301 and the suppressor electrode 304 can be adjusted automatically to the read-out values so that always an operation with a high brightness of the electron beam is ensured. In an alternative embodiment of an electron microscope, an empirical formula defining the relationship between the acceleration voltage and the voltages of the control electrode 301 and the suppressor electrode 304 which ensures that no real crossover will occur can be stored and for each adjustment of the acceleration voltage an appropriate pair of voltage values for the control electrode 301 and the suppressor electrode 304 can be calculated by the aid of this empirical formula. Then, the required voltages again can be adjusted automatically.

The supply units 102 and 202 are capable of providing an emission current of several mA (for example 1 mA to 5 mA) since there is a high emission current in the range of a few mA (for example 1 mA to 5 mA) which is transferred via the control electrode 301.

Figure 8A:
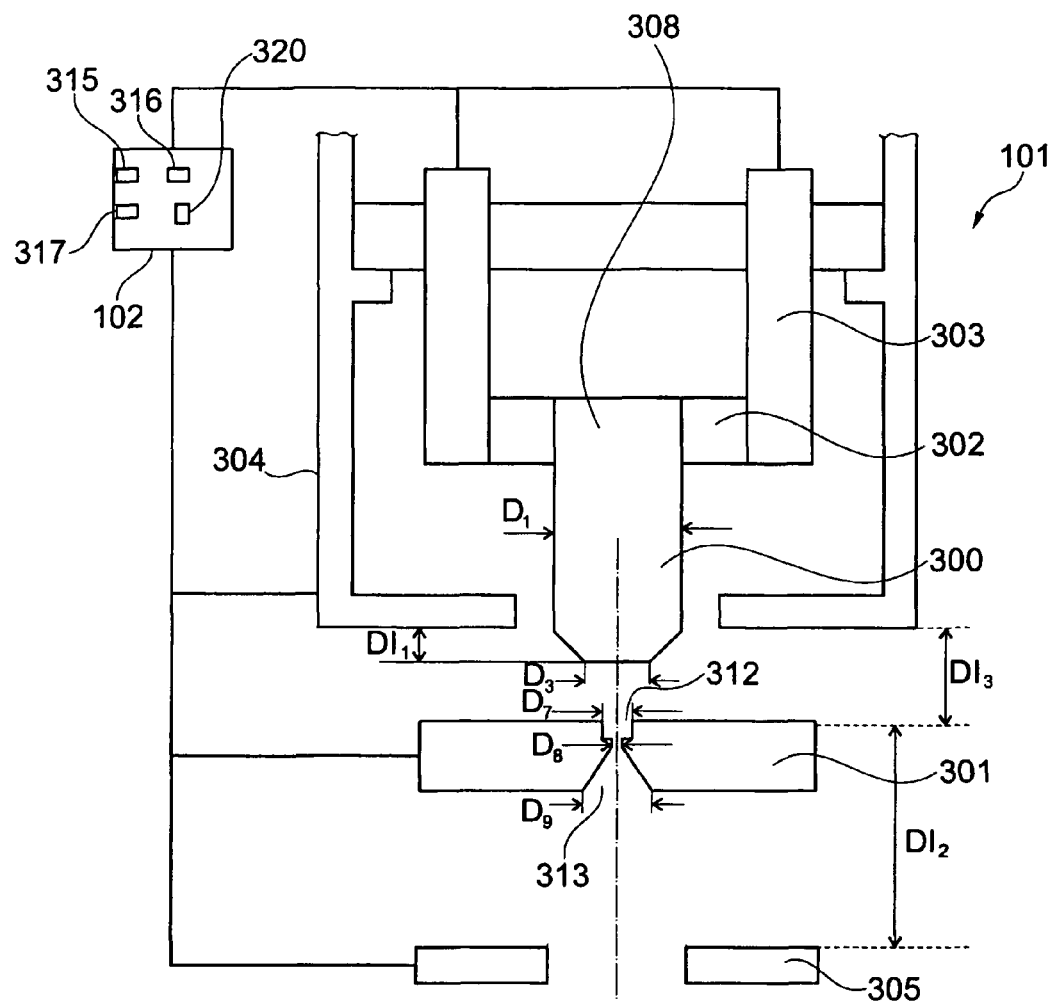
FIGS. 8A and 8B show further embodiments of electron guns according to the system described herein.
Figure 8B:
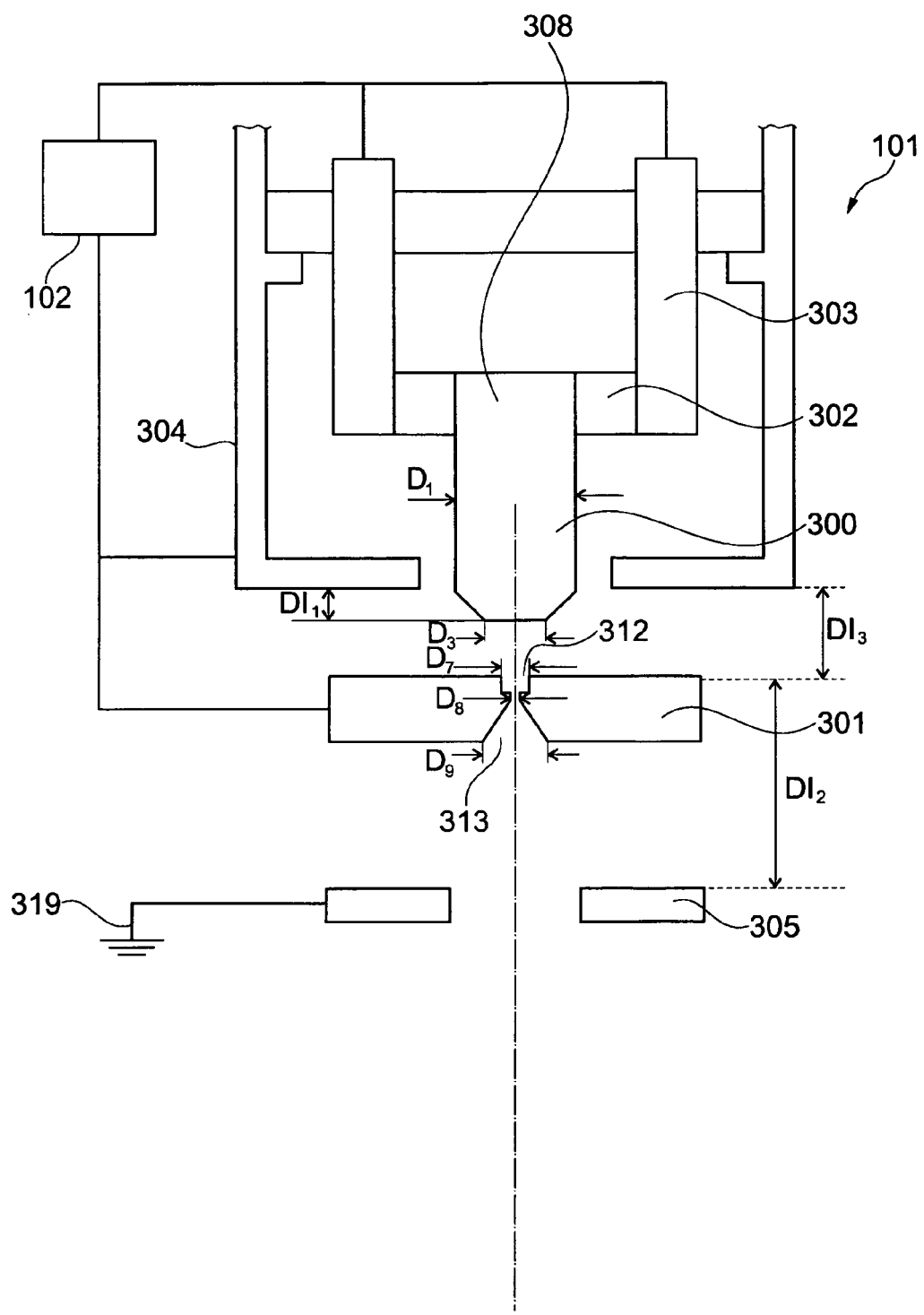

The system described herein is not restricted to the shapes of the control electrode 301, the suppressor electrode 304 and the acceleration electrode 305 as shown in FIGS. 3A and 3B. In fact, the above mentioned electrodes may be shaped in any way suitable for the system described herein. For example, FIGS. 8A and 8B show further embodiments of the electron gun 101 and 201, respectively. Identical reference numerals refer to identical units. The electron gun 101 of FIGS. 8A and 8B, respectively, is substantially similar to the electron gun 101 of FIGS. 3A and 3B, respectively. However, a difference lies in the control electrode 301, which is shaped differently.

The control electrode 301 may comprise a first recess 312 having a seventh diameter $D_7$ of approximately 400 µm which is connected to a second recess 313 via a channel having an eighth diameter $D_8$ of approximately 50 µm. The second recess 313 may be of conical shape and has a maximum ninth diameter $D_9$ of approximately 5 mm.

Other embodiments of the invention will be apparent to those skilled in the art from a consideration of the specification or practice of the invention disclosed herein. It is intended that the specification and examples be considered as exemplary only, with the true scope and spirit of the invention being indicated by the following claims.

What is claimed is:

1. An electron gun, comprising:
   at least one electron source, said at least one electron source including a thermionic electron emitter having an emission surface configured to emit electrons, wherein, during operation, the thermionic electron emitter is heated to a sufficiently high temperature to emit thermally excited electrons;
   at least one first electrode that controls a path of electrons emitted from said electron emission surface, said at least one first electrode being located at a given distance to said at least one electron source and comprising a first side and a second side, said first side and said second side being opposite to each other;
   at least one second electrode that suppresses emissions of electrons from a side surface of said at least one electron source; and
   at least one third electrode that accelerates electrons emitted from said at least one electron source,
   wherein said first side of said at least one first electrode faces said at least one second electrode,
   wherein said second side of said at least one first electrode faces said at least one third electrode,
   wherein said at least one first electrode has a first electrode potential, wherein a first voltage is a first potential difference between said first electrode potential of said at least one first, electrode and an electron source potential of said at least one electron source, wherein said first voltage is adjustable to at least a first value and a second value,
   wherein said at least one second electrode has a second electrode potential, wherein a second voltage is a second potential difference between said second electrode potential of said at least one second electrode and said electron source potential of said at least one electron source, wherein said second voltage is adjustable to at least a third value and a fourth value,
   wherein said at least one third electrode has a third electrode potential, wherein a third voltage is a third potential difference between said third electrode potential of said at least one third electrode and said electron source potential of said at least one electron source, said third voltage is adjustable to at least a fifth value and a sixth value, and
   wherein said first voltage, said second voltage and said third voltage are adjusted to avoid any crossover of electrons emitted from said electron emission surface in the path of electrons in an area between said at least one electron source and said at least one third electrode.

2. The electron gun according to claim 1, wherein said first electrode potential is positive relative to said electron source potential of said at least one electron source, wherein said second electrode potential is negative relative to said electron source potential of said at least one electron source, and wherein said third electrode potential is positive relative to said electron source potential of said at least one electron source.

3. The electron gun according to claim 1, wherein said third electrode potential of said at least one third electrode is 0 V, wherein said first electrode potential of said at least one first electrode is positive or negative relative to said third electrode potential of said at least one third electrode, and wherein said second electrode potential of said at least one second electrode is negative relative to said third electrode potential of said at least one third electrode.

4. The electron gun according to claim 1, further comprising at least one of the following features:
   said first voltage, said second voltage and said third voltage being adjusted to avoid a crossover of electrons emitted from said electron emission surface in a first path area between said at least one electron source and a second path area on a side of said at least one third electrode, which is directed towards an opposite direction with respect to the second side of said at least one first electrode.

5. The electron gun according to claim 1, wherein said at least one electron source is made of one of the following materials: a rare earth hexaboride or tungsten.

6. The electron gun according to claim 5, wherein the rare earth hexaboride is one of: lanthanum hexaboride and cerium hexaboride.

7. The electron gun according to claim 1, wherein said at least one electron source is formed as an axially symmetric truncated cone, and wherein said electron emission surface is oriented towards said at least one first electrode.

8. The electron gun according to claim 1, wherein said electron emission surface has a diameter in the range of 5 µm to 200 µm.

9. The electron gun according to claim 8, wherein the range of the diameter of said electron emission surface is 20 µm to 120 µm.

10. The electron gun according to claim 1, wherein said at least one electron source includes a first end and a second end, wherein said at least one second electrode includes an aperture, and wherein said first end of said at least one electron source protrudes through said aperture.

11. The electron gun according to claim 10, wherein said first end and said at least one second electrode are mounted at a distance from each other in the range of 0.05 mm to 0.5 mm.

12. The electron gun according to claim 11, wherein the range of the distance from said first end to said at least one second electrode is 0.2 mm to 0.3 mm.

13. The electron gun according to claim 1, wherein said at least one first electrode and said at least one second electrode are mounted at a distance from each other in the range of 0.3 mm to 1.2 mm.

14. The electron gun according to claim 13, wherein the range of the distance of said at least one first electrode from said at least one second electrode is 0.5 mm to 0.6 mm.

15. The electron gun according to claim 1, further comprising at least one of the following features:
   said at least one first electrode and said at least one third electrode being mounted at a distance from each other in the range of 3 mm to 6 mm; and
   said at least one third electrode comprising an aperture having a diameter in the range of 0.8 mm to 3.0 mm.

16. The electron gun according to claim 15, wherein the range of the distance of said at least one first electrode to said at least one third electrode is 3.5 mm to 5.5 mm.

17. The electron gun according to claim 2, further comprising at least one of the following features:

said first electrode potential of said at least one first electrode being in the range of 100 V to 1500 V;

said second electrode potential of said at least one second electrode being in the range of (−100) V to (−1) kV; and said third electrode potential of said at least one third electrode being in the range of 100 V to 30 kV.

18. The electron gun according to claim 17, wherein the range of said first electrode potential is 300 V to 900 V, wherein the range of said second electrode potential is (−300) V to (−800) V, and wherein the range of said third electrode potential is 300V to 15 kV.

19. The electron gun according to claim 3, wherein said third electrode potential of said at least one third electrode is at earth potential, wherein said first electrode potential of said at least one first electrode is in the range of 1.4 kV to (−29.9) kV, and wherein said second electrode potential of said at least one second electrode is in the range of (−200) V to (−31) kV.

20. The electron gun according to claim 19, wherein the range of said first electrode potential is 1.2 kV to (−14.9) kV, and wherein the range of said second electrode potential is (−400) V to (−16) kV.

21. The electron gun according to claim 1, wherein an axial electric field exists at said electron emission surface, said axial electric field having an axial electric field strength ($E_{Field}$) which does not result in field-emission, and wherein said axial electric field strength ($E_{Field}$) fulfills the following equation, where V is the voltage in volts and m the distance in meters:

$$1 \times 10^5 \frac{V}{m} \leq E_{Field} \leq 5 \times 10^7 \frac{V}{m}.$$

22. An electron beam device, comprising:
an electron gun that generates an electron beam,
at least one objective lens that focuses said electron beam on an object; and
at least one detector that detects interaction resulting from said focusing of said electron beam on an object,
wherein the electron gun includes:
at least one electron source, said at least one electron source including a thermionic electron emitter having an emission surface configured to emit electrons, wherein, during operation, the thermionic electron emitter is heated to a sufficiently high temperature to emit thermally excited electrons;
at least one first electrode that controls a path of electrons emitted from said electron emission surface, said at least one first electrode being located at a given distance to said at least one electron source and comprising a first side and a second side, said first side and said second side being opposite to each other;
at least one second electrode that suppresses emissions of electrons from a side surface of said at least one electron source; and
at least one third electrode that accelerates electrons emitted from said at least one electron source,
wherein said first side of said at least one first electrode faces said at least one second electrode,
wherein said second side of said at least one first electrode faces said at least one third electrode,
wherein said at least one first electrode has a first electrode potential, wherein a first voltage is a first potential difference between said first electrode potential of said at least one first electrode and an electron source potential of said at least one electron source, wherein said first voltage is adjustable to at least a first value and a second value,
wherein said at least one second electrode has a second electrode potential, wherein a second voltage is a second potential difference between said second electrode potential of said at least one second electrode and said electron source potential of said at least one electron source, wherein said second voltage is adjustable to at least a third value and a fourth value,
wherein said at least one third electrode has a third electrode potential, wherein a third voltage is a third potential difference between said third electrode potential of said at least one third electrode and said electron source potential of said at least one electron source, said third voltage is adjustable to at least a fifth value and a sixth value, and
wherein said first voltage, said second voltage and said third voltage are adjusted to avoid any crossover of electrons emitted from said electron emission surface in the path of electrons in an area between said at least one electron source and said at least one third electrode.

23. A method for controlling an electron gun, comprising:
applying a first voltage to at least one first electrode of the electrode gun;
applying a second voltage to at least one second electrode of the electrode gun;
applying a third voltage to at least one third electrode of the electrode gun;
adjusting said first voltage, said second voltage and said third voltage to control a path of electrons emitted from at least one electron source of the electrode gun, wherein the at least one electron source includes a thermionic electron emitter having an electron emission surface configured to emit electrons, wherein, during operation, the thermionic electron emitter is heated to a sufficiently high temperature to emit thermally excited electrons, and wherein said first voltage, said second voltage and said third voltage are adjusted to avoid any crossover of electrons emitted from the electron emission surface in the path of electrons in an area between said at least one electron source and said at least one third electrode.

24. The method according to claim 23,
wherein said at least one first electrode of said electrode gun controls a path of electrons emitted from said electron emission surface, said at least one first electrode being located at a given distance to said at least one electron source and comprising a first side and a second side, said first side and said second side being opposite to each other,
wherein said at least one second electrode of the electrode gun suppresses emissions of electrons from a side surface of said at least one electron source; and
wherein said at least one third electrode of the electrode gun accelerates electrons emitted from said at least one electron source,
wherein said first side of said at least one first electrode faces said at least one second electrode,
wherein said second side of said at least one first electrode faces said at least one third electrode,
wherein said at least one first electrode has a first electrode potential, wherein a first voltage is a first potential difference between said first electrode potential of said at least one first electrode and an electron source potential of said at least one electron source, wherein said first voltage is adjustable to at least a first value and a second value, wherein said at least one second electrode has a second electrode potential, wherein a second voltage is a second potential difference between said second electrode potential of said at least one second electrode and said electron source potential of said at least one electron source, wherein said second voltage is adjustable to at least a third value and a fourth value, wherein said at least one third electrode has a third electrode potential, wherein a third voltage is a third potential difference between said third electrode potential of said at least one third electrode and said electron source potential of said at least one electron source, said third voltage is adjustable to at least a fifth value and a sixth value, and wherein said first voltage, said second voltage and said third voltage are adjusted to avoid a crossover of electrons emitted from said electron emission surface.

25. The method according to claim 23, further comprising:
said adjusting said first voltage, said second voltage and said third voltage being carried out such that a crossover of electrons emitted from said electron emission surface is avoided in a first path area between said at least one electron source and a second path area on a side of said at least one third electrode, which is directed towards an opposite direction with respect to the second side of said at least one first electrode.

26. An electron gun, comprising:
at least one electron source, said at least one electron source including a thermionic electron emitter having an emission surface configured to emit electrons, wherein, during operation, the thermionic electron emitter is heated to a sufficiently high temperature to emit thermally excited electrons;
a supply unit that that provides an axial electric field at the electron emission surface, the axial electric field having an axial electric field strength which does not result in thermal field emission;
at least one first electrode that controls a path of electrons emitted from said electron emission surface, said at least one first electrode being located at a given distance to said at least one electron source and comprising a first side and a second side, said first side and said second side being opposite to each other;
at least one second electrode that suppresses emissions of electrons from a side surface of said at least one electron source; and
at least one third electrode that accelerates electrons emitted from said at least one electron source,
wherein said first side of said at least one first electrode faces said at least one second electrode,
wherein said second side of said at least one first electrode faces said at least one third electrode,
wherein said at least one first electrode has a first electrode potential, wherein a first voltage is a first potential difference between said first electrode potential of said at least one first electrode and an electron source potential of said at least one electron source, wherein said first voltage is adjustable to at least a first value and a second value,
wherein said at least one second electrode has a second electrode potential, wherein a second voltage is a second potential difference between said second electrode potential of said at least one second electrode and said electron source potential of said at least one electron source, wherein said second voltage is adjustable to at least a third value and a fourth value, wherein said at least one third electrode has a third electrode potential, wherein a third voltage is a third potential difference between said third electrode potential of said at least one third electrode and said electron source potential of said at least one electron source, said third voltage is adjustable to at least a fifth value and a sixth value, and wherein said first voltage, said second voltage and said third voltage are adjusted to avoid any crossover of electrons emitted from said electron emission surface in the path of electrons in an area between said at least one electron source and said at least one third electrode.

27. An electron beam device, comprising:
an electron gun that generates an electron beam,
at least One objective lens that focuses said electron beam on an object; and
at least one detector that detects interaction resulting from said focusing of said electron beam on an object,
wherein the electron gun includes:
at least one electron source, said at least one electron source including a thermionic electron emitter having an emission surface configured to emit electrons, wherein, during operation, the thermionic electron emitter is heated to a sufficiently high temperature to emit thermally excited electrons;
a supply unit that provides an axial electric field at the electron emission surface, the axial electric field having an axial electric field strength which does not result in thermal field emission;
at least one first electrode that controls a path of electrons emitted from said electron emission surface, said at least one first electrode being located at a given distance to said at least one electron source and comprising a first side and a second side, said first side and said second side being opposite to each other;
at least one second electrode that suppresses emissions of electrons from a side surface of said at least one electron source; and
at least one third electrode that accelerates electrons emitted from said at least one electron source,
wherein said first side of said at least one first electrode faces said at least one second electrode,
wherein said second side of said at least one first electrode faces said at least one third electrode,
wherein said at least one first electrode has a first electrode potential, wherein a first voltage is a first potential difference between said first electrode potential of said at least one first electrode and an electron source potential of said at least one electron source, wherein said first voltage is adjustable to at least a first value and a second value,
wherein said at least one second electrode has a second electrode potential, wherein a second voltage is a second potential difference between said second electrode potential of said at least one second electrode and said electron source potential of said at least one electron source, wherein said second voltage is adjustable to at least a third value and a fourth value,
wherein said at least one third electrode has a third electrode potential, wherein a third voltage is a third potential difference between said third electrode potential of said at least one third electrode and said electron source potential of said at least one electron source, said third voltage is adjustable to at least a fifth value and a sixth value, and wherein said first voltage, said second voltage and said third voltage are adjusted to avoid any crossover of electrons emitted from said electron emission surface in the path of electrons in an area between said at least one electron source and said at least one third electrode.

28. The electron gun according to claim 1, wherein an axial electric field exists at said electron emission surface, and wherein said axial electric field has an axial electric field strength which does not result in thermal field emission.

29. The electron beam device according to claim 22, wherein an axial electric field exists at said electron emission surface, and wherein said axial electric field has an axial electric field strength which does not result in thermal field emission.

30. The method according to claim 23, wherein an axial electric field exists at said electron emission surface, and wherein said axial electric field has an axial electric field strength which does not result in thermal field emission.

31. The electron gun according to claim 1, wherein the electron gun is operated with a residual pressure of about $10^{-5}$ mbar to $10^{-7}$ mbar.

32. The electron beam device according to claim 22, wherein the electron gun is operated with a residual pressure of about $10^{-5}$ mbar to $10^{-7}$ mbar.

33. The method according to claim 23, wherein the electron gun is operated with a residual pressure of about $10^{-5}$ mbar to $10^{-7}$ mbar.

34. The electron gun according to claim 1, wherein said first electrode potential of said at least one first electrode is in the range of 100 V to 1500 V.

35. The electron beam device according to claim 22, wherein said first electrode potential of said at least one first electrode is in the range of 100 V to 1500 V.

36. The method according to claim 23, wherein a first electrode potential of said at least one first electrode is in the range of 100 V to 1500 V.

* * * * *